United States Patent
Pinkham et al.

[11] Patent Number: 5,914,908
[45] Date of Patent: Jun. 22, 1999

[54] METHOD OF OPERATING A BOOSTED WORDLINE

[75] Inventors: Ray Pinkham, Los Gatos; Paul Lazar, Santa Clara; Cheow F. Yeo, San Jose, all of Calif.

[73] Assignee: Hyundai Electronics America, San Jose, Calif.

[21] Appl. No.: 08/847,885

[22] Filed: Apr. 28, 1997

Related U.S. Application Data

[63] Continuation-in-part of application No. 08/818,802, Mar. 14, 1997.

[51] Int. Cl.$^6$ .................................................. G11C 8/00
[52] U.S. Cl. ......................... 365/230.06; 365/189.06; 365/189.11; 327/589
[58] Field of Search .................... 365/230.06, 189.06, 365/189.11; 327/390, 589

[56] References Cited

U.S. PATENT DOCUMENTS

| | | | |
|---|---|---|---|
| 4,533,843 | 8/1985 | McAlexander, III et al. | 307/530 |
| 4,543,500 | 9/1985 | McAlexander, III et al. | 307/530 |
| 4,748,349 | 5/1988 | McAlexander, III et al. | 307/530 |
| 5,222,042 | 6/1993 | Ichiguchi | 365/189.01 |
| 5,253,204 | 10/1993 | Hatakeyama et al. | 365/189.06 |
| 5,313,429 | 5/1994 | Chevallier et al. | 365/226 |
| 5,582,171 | 12/1996 | Tokami et al. | 365/230.01 |
| 5,659,519 | 8/1997 | Lee et al. | 365/230.06 |
| 5,696,731 | 12/1997 | Miyamoto | 365/233.5 |

OTHER PUBLICATIONS

Joynson et al. "Eliminating Threshold Losses in MOS Circuits by Bootstrapping Using Varactor Coupling", *IEEE Journal of Solid–State Circuits*, vol. SC–7, No. 3, Jun. 1972, pp. 217–224.

Martino et al., "An On–Chip Back–Bias Generator for MOS Dynamic Memory", *IEEE Journal of Solid–State Circuits*, vol. SC–15, No. 5, Oct. 1980, pp. 820–826.

Fujishima et al., "A Storage–Node–Boosted RAM with Word–Line Delay Compensation", *IEEE Journal of Solid–State Circuits*, vol. SC–17, No. 5, Oct. 1982, pp. 872–976.

*Primary Examiner*—David Nelms
*Assistant Examiner*—Hoai V. Ho
*Attorney, Agent, or Firm*—Townsend & Townsend & Crew LLP

[57] ABSTRACT

A method of improving the boosted wordline compliance of a memory circuit. A wordline is grounded prior to boosting with a voltage greater than the circuit bias voltage (e.g. vdd) from a boost voltage generator. Grounding the wordline pulls the gate of a pass transistor to the bias voltage minus a threshold voltage and prepares the pass transistor to self-boost upon boosting the wordline. The transconductance of the pass transistor is improved, improving the charge transfer from the boost generator to the wordline, decreasing rise time. In another embodiment, an isolation transistor between the wordline select circuit and the pass transistor is boosted to provide additional pass transistor gate voltage.

8 Claims, 7 Drawing Sheets

METHOD OF OPERATING A BOOSTED WORDLINE

CROSS REFERENCE TO A RELATED APPLICATION

This application is a continuation in part of the application Ser. No. 08/818,802, entitled "Pump Control Circuit" by Pinkham, et al., filed Mar. 14, 1997 (currently not assigned an application serial number), which is herein incorporated by reference for all purposes.

BACKGROUND OF THE INVENTION

This invention relates to digital memory circuits, and in particular to dynamic random access memory (DRAM) circuits. The invention teaches a circuit and a method for extending the row activation time of one or multiple banks of DRAM, thereby increasing the number of bits per second that may be written or read from the DRAM.

Nearly all DRAM architectures include arrays of memory cells. FIG. 1 shows a portion of a typical DRAM circuit with a row of memory cells 110a–n. A row may, for example, contain 1024 memory cells, and there may be many rows within an array (not shown). Each cell typically has capacitor 102a for storing charge, and pass transistor 104a that passes the charge on capacitor 102a to data, or bit, line 106a. Sense amplifier 108a on bit line 106a detects and holds (latches) the logic state of the memory cell when the cell is activated.

Typically, a row of memory cells are simultaneously activated by a wordline 120. The wordline turns on the gate of the pass transistor, and allows charge to flow to or from the storage capacitor. This allows the data stored in the cell to be read by the sense amplifier (i.e. latch the sense amplifier), or new data, as latched into the sense amplifier, may be written to the cell.

Selecting a new row with a wordline takes a relatively long time. First, the new row's address must be decoded by partial row decoder 160, before the wordline is activated by row activation circuit 130. Second, wordlines have capacitance and series resistance, which results in an RC time constant that increases the time it takes for the wordline to reach its full active voltage. Third, charging all the cells on a wordline may result in voltage transients that are equal in magnitude to the signal output of the storage capacitor. These transients must settle before the memory cell contents may be reliably read. Therefore, the access time between selecting a wordline and fetching that data from the sense amplifiers is relatively long (about 30 ns).

Additionally, adjacent rows of memory cells typically share sense amplifiers, so one row may need to be deactivated, that is, have its wordline turned off, before another row is activated. Deactivation requires a restore and precharge cycle to set the memory cell to its desired logic state. The restore cycle removes the voltage on the currently active wordline. The precharge cycle engages the precharge circuit 105a so that the bitlines are equilibrated in preparation for the next row activation. These operations can take an additional 20 ns. Thus, it typically takes about 50 ns to precharge and close an active row, and then about 30 ns to open a new row and read its contents.

Information from an active row (one having an active wordline, that is, a wordline with a voltage above an activation voltage) may be read/written faster than from an inactive row because the sense amplifiers are already latched to the state they have read from the storage capacitors. Data may be read from the sense amplifiers in about 10 ns as long as that row is open. No precharging, restoring, or row access operations need to be performed. Likewise, write operations to currently active rows can be done in a fraction of the time that it takes to perform a precharge operation and activate a new row. If a row can be held open longer, or if more rows could be held open, the performance of the DRAM would improve by allowing more bits/second to pass in and out of the memory.

However, there are inherent limitations imposed on how long a row can be kept active. If pass transistor 104a is NMOS, its gate (the wordline 120) must be boosted above the source voltage ($V_{DD}$) by at least the threshold voltage ($V_T$) of pass transistor 104a to achieve an activation voltage sufficient to write or restore the storage capacitor 102a to a full $V_{DD}$ level. Therefore, the wordline 120 shown in FIG. 1, when activated, is generally boosted above $V_{DD}$ as disclosed by McAlexander, et al. in U.S. Pat. No. 4,533,843, Aug. 6, 1985. Such boosting is typically done by creating a boosted voltage in boot-strap generator (boost generator) 150. The boosted voltage is commonly referred to as phi_bs and is also commonly referred to as "boot-strapped."

Each boost operation transfers a finite amount of charge from the boost generator circuit to a boosted node, and the voltage at the boosted node decays over time as this charge leaks off the node. Because of this boosted voltage loss, DRAMs are typically specified with a maximum row activation time. That is, the time the wordline stays above $V_{DD}+V_T$ after the wordline has been boosted.

To extend this activation time, circuit designers have devised ways to pump active boosted nodes with additional charge. Some methods use either free running or clocked auxiliary pump circuits (not shown). These auxiliary pump circuits add incremental charge to phi_bs on a repeating pump cycle, keeping phi_bs at a relatively constant voltage.

These techniques share at least two problems. The first problem is that auxiliary pump circuits take up relatively large amounts of chip area. This increases the chip size for a given memory array site.

The second problem is that for the wordline to reach full phi_bs, the gate voltage of wordline driver transistor 132 must be greater than phi_bs plus the threshold voltage of this transistor. This requires that the gate node of the driver transistor (n2) 135 be double-boosted to a double-boosted voltage (not shown). This double-boosted node loses charge, and hence drops in voltage, similarly to the wordline. Thus, the row activation time is also limited by the decay time of the gate voltage on driver transistor 132. Auxiliary pump circuits do not restore this node to a double-boosted voltage, and therefore these methods have limited row activation times.

Maintaining all boosted nodes in the row and sense path at boosted and double-boosted voltage levels for an indefinite period of time promises a significant increase in the data bandwidth of memory chips. It is furthermore desirable that this be accomplished without additional pump circuitry, without interrupting read and write operations, and without complex, bandwidth-limiting control logic.

SUMMARY OF THE INVENTION

The present invention offers an improved dynamic random access memory (DRAM) chip that maintains more memory cell rows active for longer periods of time than prior chips. This results in greater rates of data transmission. Average DRAM access time is improved by extending row activation time, and by extending the number of active rows that may be pumped with a single boot-strap generator in a given period of time. The present invention achieves this result by restoring a boosted voltage to a wordline and a double-boosted voltage to a wordline driver gate in a DRAM circuit before those voltages drop below a critical level. In one embodiment, this method is implemented without performing a row-select operation and without adding auxiliary pump circuits.

The DRAM device typically has a plurality of arrays of rows of memory cells. When a controller selects an array to be activated, a boost-voltage generator develops a boost-voltage according to an array-select signal and a global activate command. A single boost-voltage generator may serve more than one array. In one embodiment the boost-voltage generator contains a boot-strap circuit that produces the boost-voltage, and additional control circuitry for initiating a pump sequence. The global pump command is a signal generated by a clock that sets the pumping rate of the boost-voltage generator. The output of the boost-voltage generator is routed via a path decoder to activate the selected row.

In another embodiment of the invention, the boost-voltage generator has additional circuitry that produces a wordline transfer boost voltage. This wordline transfer boost voltage is coupled to the gate of an isolation transistor in a row activation circuit. Boosting the isolation transistor gate to this level allows the gate of the driver transistor in that row activation circuit to be precharged to the full voltage source level ($V_{DD}$).

Once an array is active, the same boost-voltage generator generates a subsequent boost-voltage pump in response to a boost enable signal. The boost enable signal may be generated by control logic external to the DRAM, such as from timing and interrupt signals from an external controller, or an internal controller may generate a discrete boost enable signal. Alternatively, the boost enable signal may be generated by clocked or self-timed circuits on the DRAM chip.

In one embodiment, the boost enable signal is generated by a pump multiplexer that passes a pump bit, as a token, around a ring of pump multiplexers. Each pump multiplexer is associated with one or more memory arrays. If an associated array is active when the pump bit arrives at the multiplexer, the multiplexer will generate a boost enable signal on the next global pump command and boost that array, passing the pump bit to the next multiplexer in the ring.

Each memory array may be further divided into sub-arrays. These sub-arrays may be arranged so that they share sense amplifiers. In such an arrangement, only one sub-array of a complimentary pair may be active at any time. In a further embodiment of the invention, sub-arrays that share sense amplifiers share boost voltage generator circuits. A boost voltage path decoder routes the boost voltage to the active sub-array. When the complimentary sub-array is selected by the controller, de-activating the first sub-array, the path decoder automatically routes the boost voltage to this newly active sub-array.

A further understanding of the nature and advantages of the pump control circuit of the present invention may be realized by reference to the remaining portions of the specification and the attached drawings.

DESCRIPTION OF SPECIFIC EMBODIMENTS

A dynamic random access memory (DRAM) chip typically has arrays of memory cells that are accessed by activating a wordline. A memory cell with an active wordline can be read or written to faster than a memory cell that must have its row selected and activated. Holding as many arrays of memory cells in an active state for as long as possible improves the average data transfer rate of a DRAM.

First Embodiment—without a boosted wordline transfer

Figure 1:
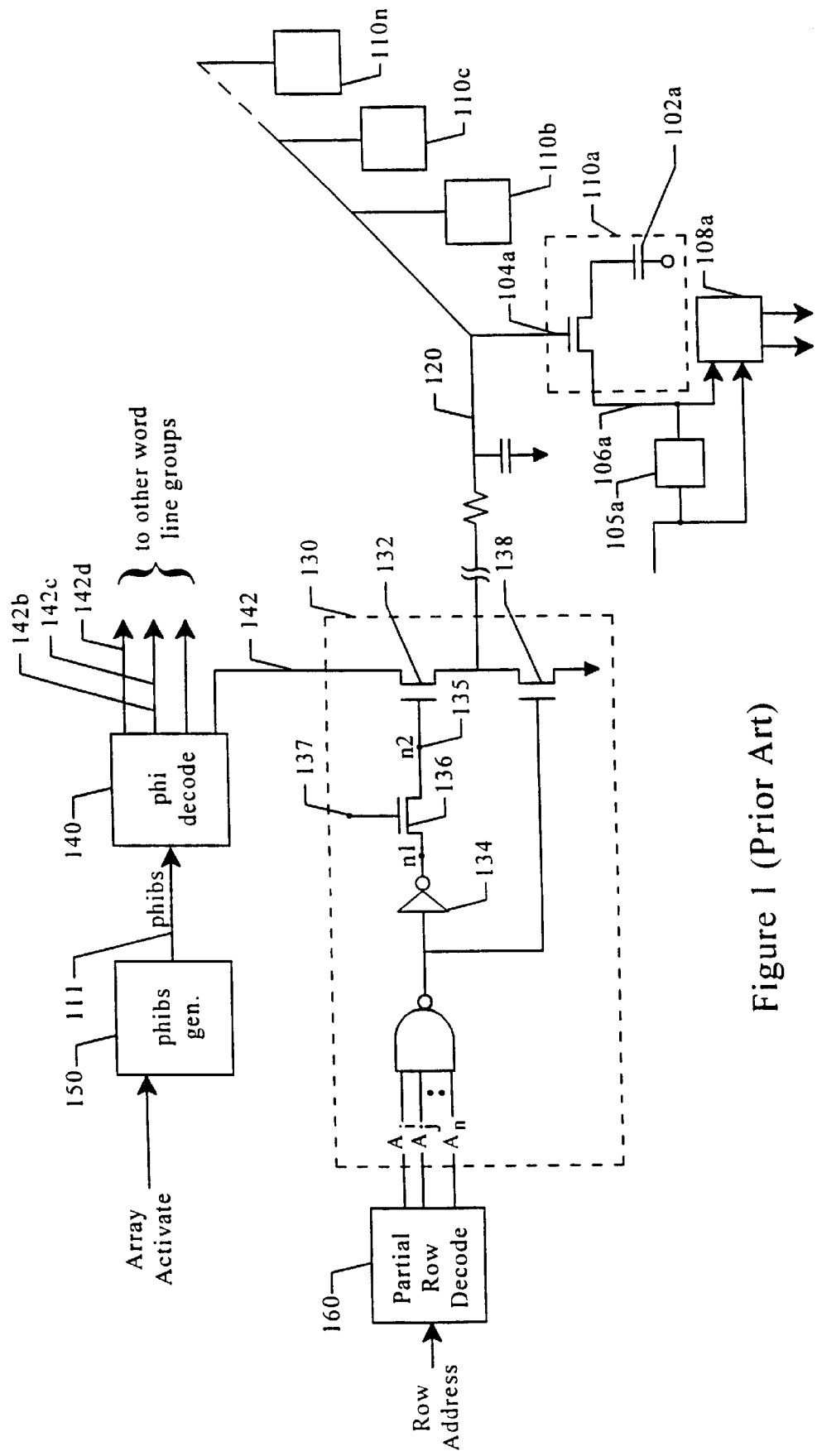
FIG. 1 shows part of a typical DRAM circuit, including a row of memory cells in an array, a wordline pass circuit, a boost-voltage generator, and a boost-voltage decoder.
Figure 2A:
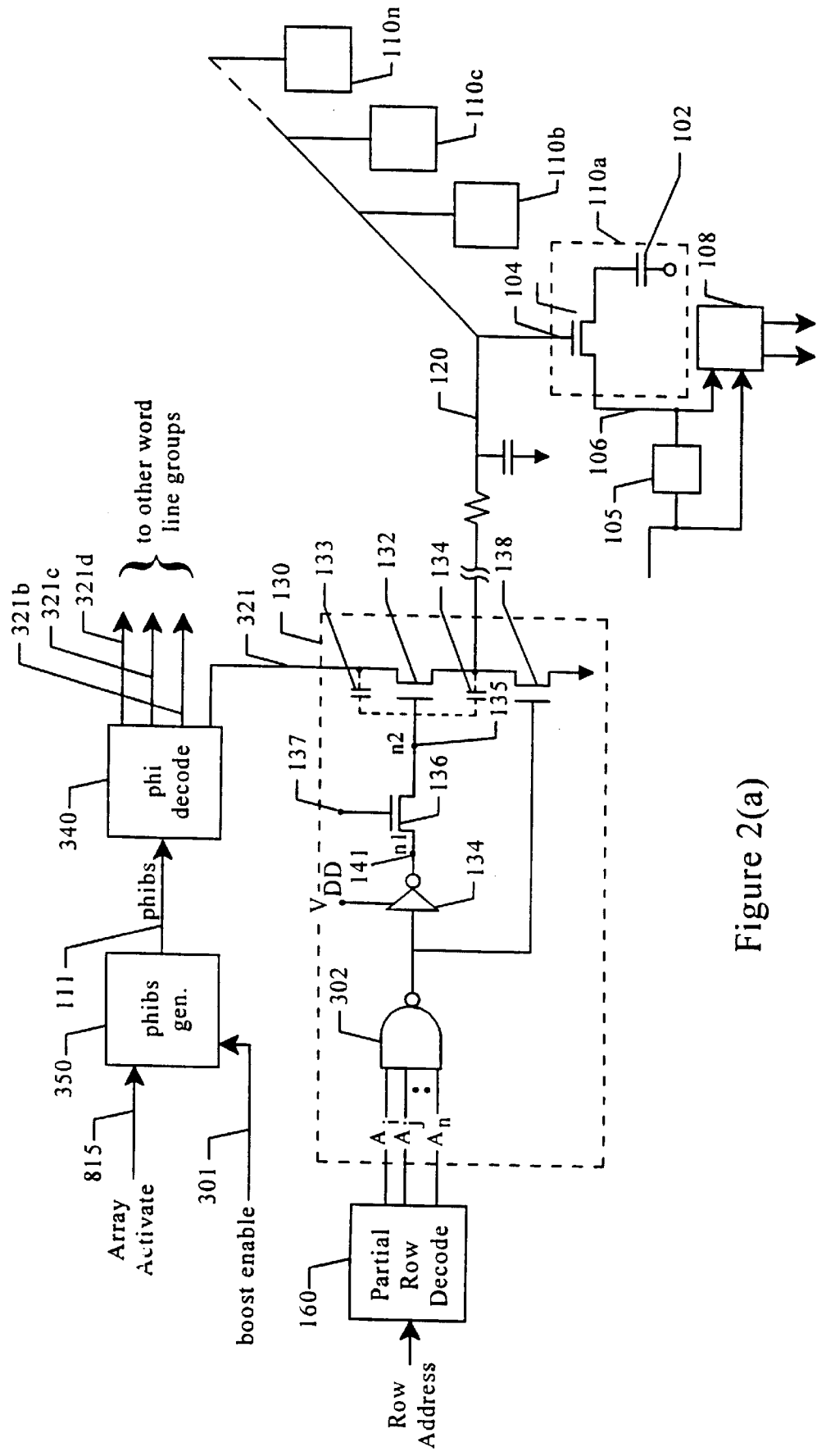
FIG. 2(a) shows part of an improved DRAM circuit, including a boost-enable line that allows boosting to occur independently of selecting an addressed row, in accordance with one embodiment of the present invention.

FIG. 2(a) is a partial schematic diagram of the row and sense path of a DRAM showing one embodiment of the present invention. In this embodiment, gate 137 of transistor 136 is driven by the supply voltage, $V_{DD}$. Boost voltage generator 350 provides a voltage of about 1.5 $V_{DD}$ by standard charge-transfer methods. Boost voltage generator 350 pumps line 111 upon command of either an array activate signal 815 or, alternatively, a boost enable signal 301. Boost enable signal 301 performs a pump operation which restores line 111 to a boosted voltage level without an array activation operation.

An array activation operation enables the partial row decoder 160. Logic gate 302 fully decodes the row address and sets n2 135 to $V_{DD}$ minus the threshold voltage ($V_T$) of wordline isolation transistor 136. Node n1 141 is set to $V_{DD}$ by the invertor 139. Boosted voltage output 111 from boost voltage generator 350 is routed to boosted voltage line 321 via boost voltage path decoder 340. When row line 120 is to be selected, the upward change in voltage on line 321 couples charge to n2 135 via parasitic capacitances $C_{GD}$ 133 and $C_{GS}$ 134. This brings the voltage on n2 above the voltage on gate 137 of isolation transistor 136. The higher voltage on n2 allows drive transistor 132 to pass more of the pump voltage to wordline 120 than if n2 135 were at $V_{DD}$. The wordline activates a row of memory cells by supplying an activation voltage sufficient to allow data transfer the memory cells in the row and their associated sense and charge circuitry.

The voltage on n2 135 and wordline 120 decays due to charge leakage from these nodes, as is known to those skilled in the art. Eventually, the voltage will decay below $V_{DD}+V_T$ of driver transistor 132 and pass transistor 104, respectively, reducing the wordline voltage accordingly. A second pump operation restores the wordline to a boosted voltage, allowing its memory array to remain active.

Figure 2B:
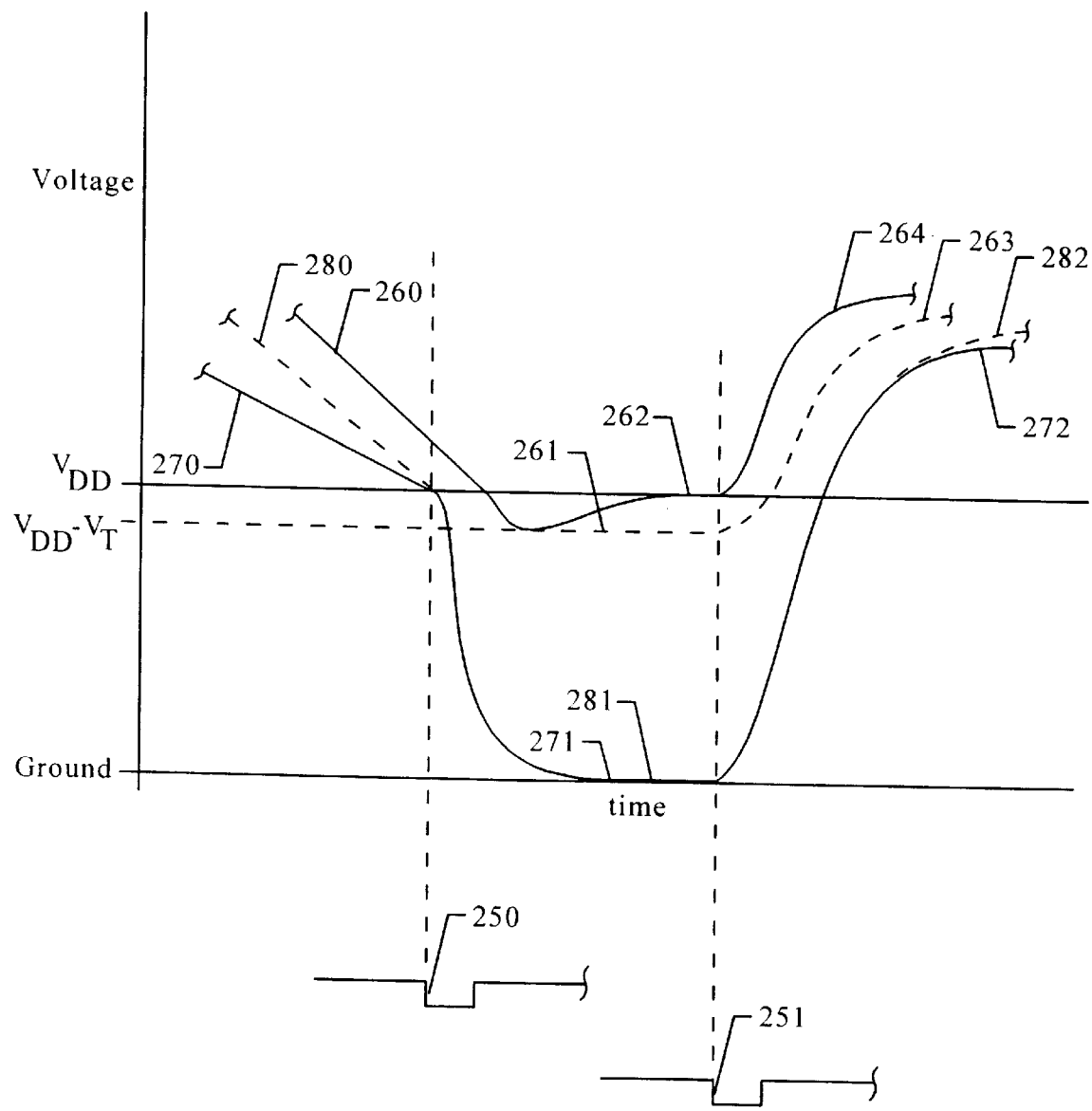
FIG. 2(b) shows selected voltages versus time during a pump set and pump reset sequence.

FIG. 2(b) illustrates the voltage at node n2 260, the wordline voltage 270, and the boosted voltage 280 versus time during a second pump operation. The second pump operation occurs in response to a boost enable signal (301 FIG. 2(a)). A boost enable signal is a signal, other than an array activation signal, which causes boost voltage generator 350 to produce a voltage pump operation. In a pump operation, a pump reset signal 250, which may be a pulse, as described below in the Pump Multiplexer and Pump Enable sections that refer to FIGS. 5 and 6, causes the boosted voltage line 321 (FIG. 2(a)) to be pulled to ground 281 by a circuit within the boost voltage generator 350. This resets the wordline 120 (FIG. 2(a)) to ground 271 and node n2 to an initial voltage. Node n2 is coupled down, but is clamped to $V_{DD}-V_T$ (if there is no boosted wordline transfer) 261 or to $V_{DD}$ (if the wordline transfer has been boosted, as discussed below) 262. A pump set pulse 251 causes a voltage pump from the boost voltage generator to boost voltage line 321 to a boosted voltage 282, which also boosts the wordline to a boosted voltage 272 because node n2 is returned to its double-boosted state 263 (or 264 if the wordline transfer has been booted).

This enable signal may originate from a timing circuit coupled directly to the DRAM control logic, by discrete commands originating from a separate control block, or from an embedded frame buffer controller incorporated in the DRAM chip, for example. After the pump operation is complete, all boosted nodes are restored to the same high voltage level as when they were generated by the array activation operation. Subsequent boost enable signals can keep a wordline active indefinitely, or until it is de-selected and de-activated.

During the post-activation pump operations, read and write operations can proceed uninterrupted in the array being pumped because all read data is being fetched from the latched bit line sense amplifiers, and all writes are being performed on the same bit line sense amplifiers. The pump operation is completely transparent to normal read and write operations. With sufficiently frequent pump operations, the wordline will be boosted until the array is deselected, assuring proper data restoring to the memory array.

Second Embodiment—with a boosted wordline transfer

Figure 3:
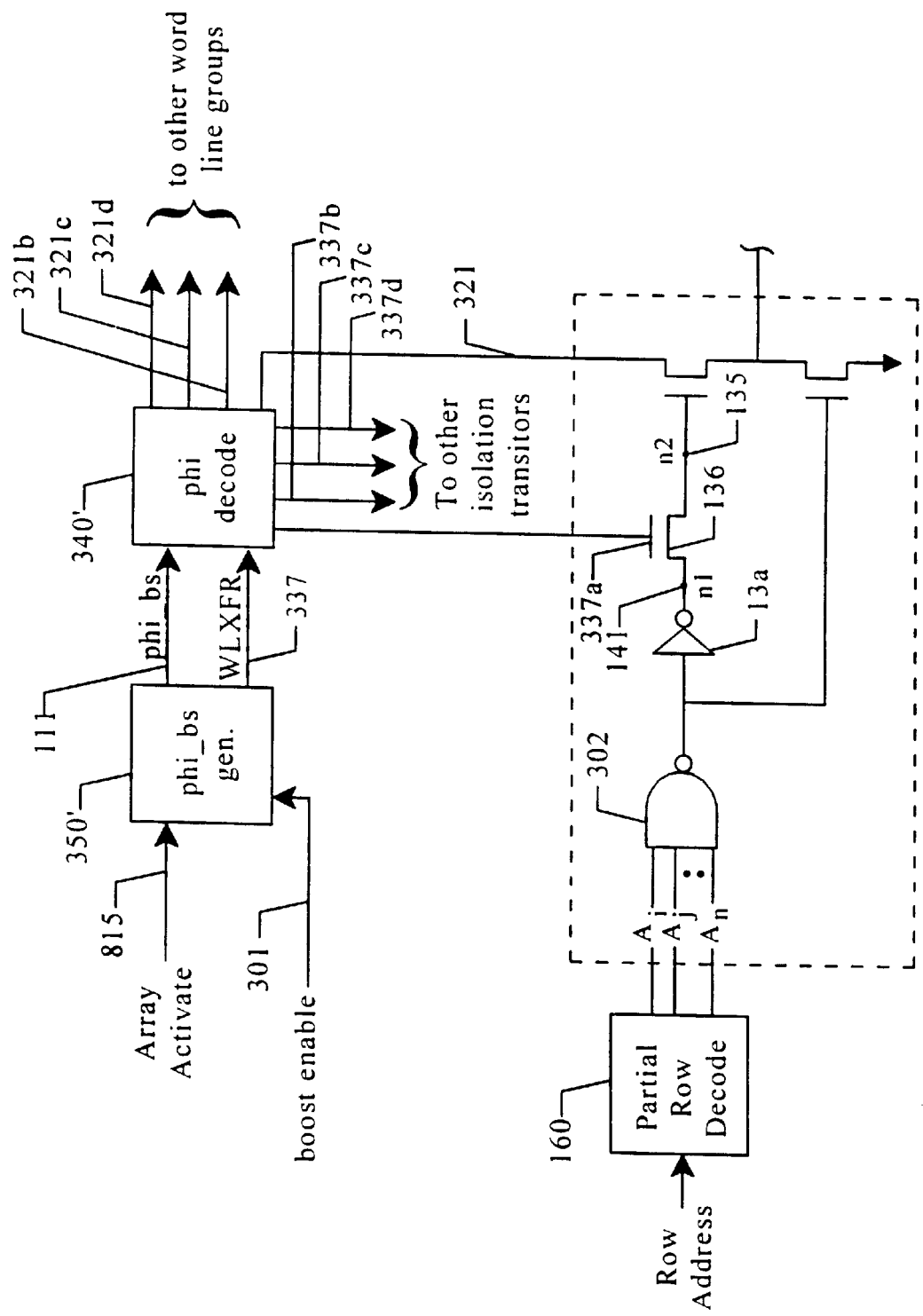
FIG. 3 shows part of an improved DRAM circuit, including a separate wordline transfer voltage boost.

FIG. 3 shows another embodiment of the invention wherein a wordline-transfer boost-voltage pump (WLXFR) 337 is generated by boost voltage generator 350', in addition to the wordline boost voltage (phi_bs) 111. WLXFR 337 is boosted above $V_{DD}$ near the beginning of a row activation cycle. Boost voltage path decoder 340' routes WLXFR 337 to isolation transistor gate 337a. Invertor 139 of the selected row does not go HI until after WLXFR 337a has been boosted. Since WLXFR 337a is boosted above $V_{DD}+V_T$, node n2 135 reaches a full $V_{DD}$ level before phi_bs 111 is boosted. Just before phi_bs 111 is boosted, WLXFR 337 is clamped back to $V_{DD}$.

Therefore, when phi_bs 111 is boosted, charge is transferred from line 321 to n2 135 via the gate-drain capacitance 133 of driver transistor 132. As in the first embodiment, charge does not flow from node n2 back through isolation transistor 136 because n1 141 is at the same voltage as WLXFR 337a. Therefore, node n2 135 achieves a doubled boosted voltage which is higher than that described in the first embodiment by at least approximately $V_T$. This increases the transconductance of driver transistor 132, which reduces the rise time of wordline 120 and speeds overall data access.

In this embodiment, the timing for the WLXFR pump is controlled similarly to the phi_bs boost voltage pump for either an array activate pump operation or a boost enable pump operation. This insures that the same double boosted level originally achieved during the array activation cycle is re-established with subsequent pump cycles.

Implementations Of Pump Control Circuitry

Figure 4:
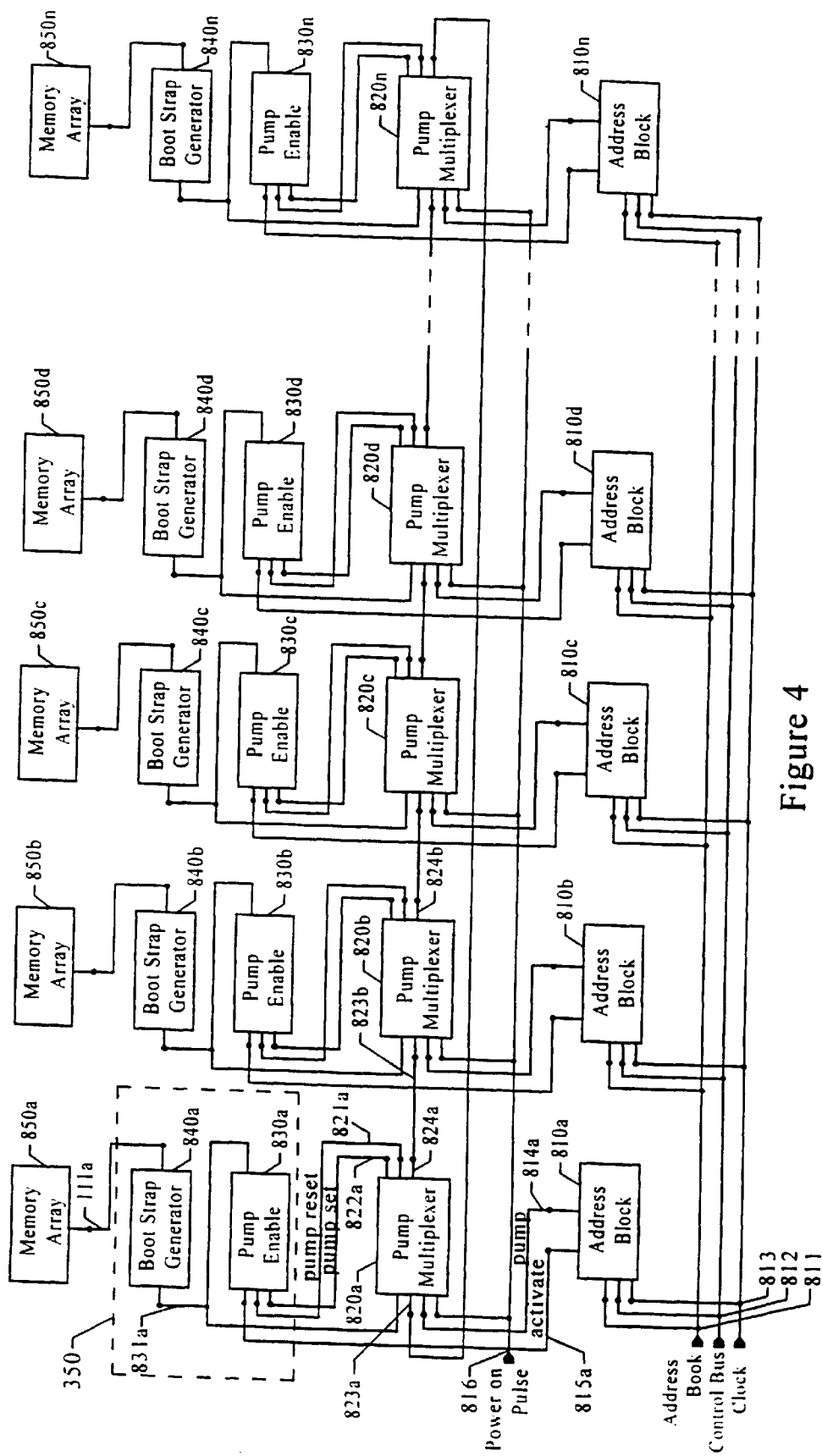
FIG. 4 is a block diagram of memory arrays and associated circuit blocks which generate pump enable signals.

FIG. 4 shows a portion of an embedded frame buffer that can generate an on-chip boost enable signal. FIG. 4 is a simplification of an actual frame buffer, which may have additional control lines or circuits. For example, only one wordline per array is shown for simplicity of illustration. Actual memory arrays would have several wordlines with associated decoder circuits that route the boosted voltage to the appropriate wordline. Since, only one wordline per array is booted at any given time and the illustration is representative.

The pump control circuits associated with memory array 850a consist of pump address block 810a, pump multiplexer block 820a, pump enable block 830a, and boot-strap generator block 840a. The pump address 810a–n blocks are connected to a common address bus 811 and a common control bus 812. A common clock 813 is shown for a synchronous implementation. Those skilled in the art know that an asynchronous control could be used by means of address transition detection, or other suitable control signals. Those skilled in the art will also appreciate that partitioning of the control into these four specific blocks is arbitrary, and that each block may be implemented by a variety of specific circuits.

Pump Address

The pump address block 810a receives address and control signals which generate an activate signal 815a according to the selected address from a controller (not shown) on address bus 811 and a signal on control bus 812. Array activate signal 815a is passed to pump enable block 830a, where it initiates wordline boost voltage pump 111a (It would also initiate boosting of WLXFR 337, FIG. 3, in an embodiment incorporating this aspect, as described above. The following discussion omits separate reference to WLXFR). In this embodiment, the pump address blocks also respond to a global pump signal (not shown) on control bus 812. If the global pump signal is HI at the proper time, pump address block 810a provides a local pump pulse on pump line 814a. This local pump pulse triggers a pump enable sequence if the associated array is active. In one embodiment, the local pump pulse may originate from a controller external to the DRAM chip. In another embodiment, the local pump pulse may originate from timing or logic circuits on the DRAM chip. Either embodiment may use methods such as a signal that is generated at regular intervals according to a timing signal (clock) and an interrupt signal. These controllers may generate the local pump pulse according to programmed, synchronously timed, or asynchronously timed logic.

Pump Multiplexer

Pump multiplexer block 820a is one embodiment of an on-chip method of rebooting an active wordline without going through an address and select operation. In one embodiment, pump multiplexer block 820a operates as one position of a serial shift register. In this embodiment, the pump multiplexer stores a pump bit (not shown) and passes it to the next pump multiplexer block after receipt of a local pump pulse, 814a.

The presence of the pump bit at a pump multiplexer block allows the pump multiplexer block to generate signals which reboot the wordline of the associated array. The wordline is booted if: (1) the array is currently addressed (i.e. pump enable (phibs_en) signal 831a is HI), and (2) the pump bit is present at that array's pump multiplexer block (i.e. pump-in 823a is HI), and (3) the multiplexer receives a local pump pulse 814a. Only one pump multiplexer block in the shift register chain has the pump bit at any time, so only one boost voltage generator in the chain will pump its associated wordline.

Figure 5:
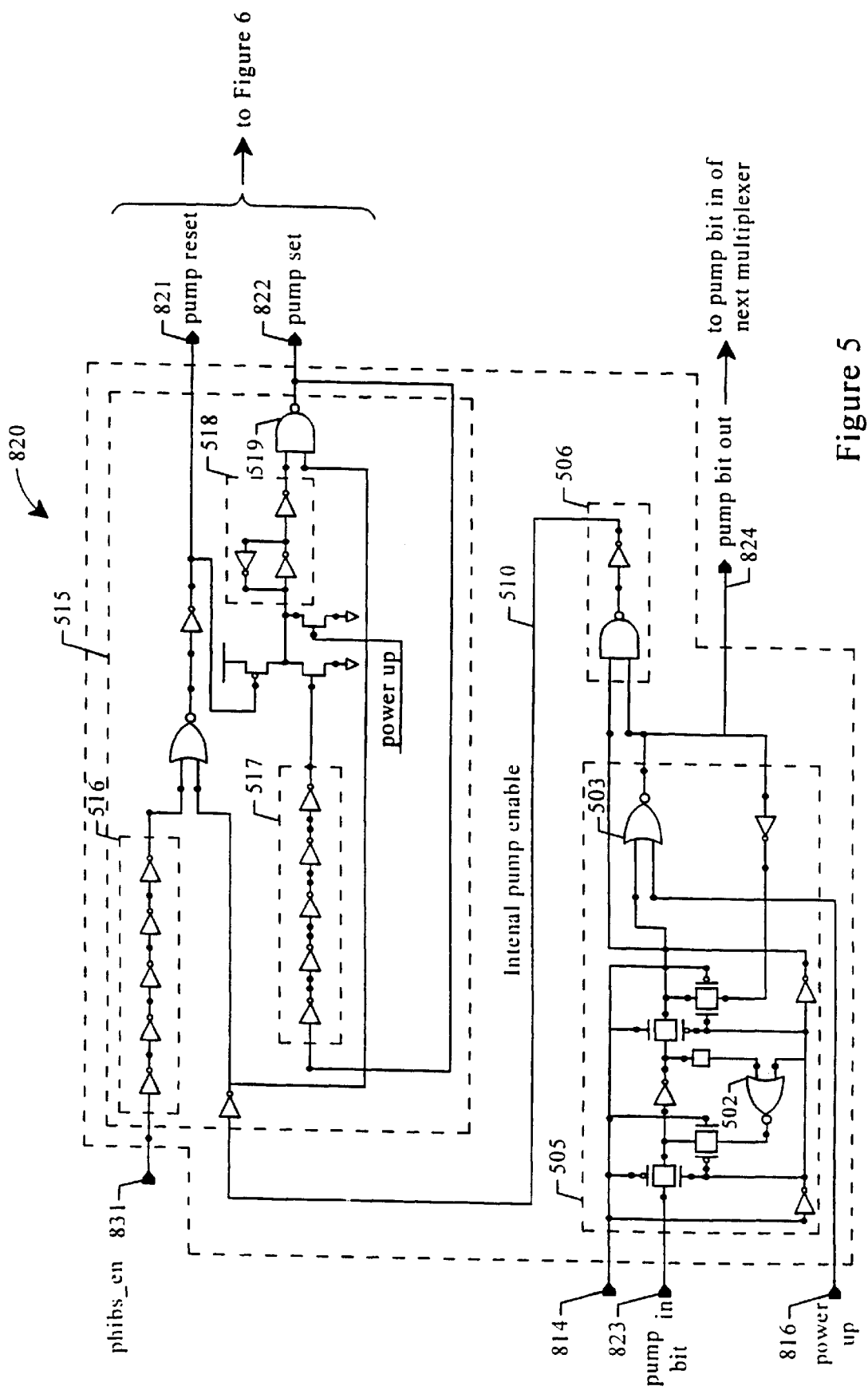
FIG. 5 is a circuit diagram of one embodiment of a pump multiplexer circuit of FIG. 4.

FIG. 5 shows one possible embodiment of a pump multiplexer circuit. The pump multiplexer latches pump input 823 in response to a rising edge on local pump pulse 814. The pump input is LO if the pump bit is not present at the pump input of that pump multiplexer and HI if the pump bit is present. If a pump multiplexer stage has the pump bit, then the combined presence of the pump bit and a local pump pulse produces internal pump enable signal 510. Pump multiplexer block 820 passes the pump bit, if present, to the next pump multiplexer block (not shown in FIG. 5) on pump bit out 824 and sets flip-flop 505 to a HI level. In this fashion, the pump bit circulates from array to array, only one array in the chain having the HI pump bit. Those skilled in the art know that HI and LO are relative terms and do not limit the operation of this circuit.

In this implementation, a pulse is provided on line 816 at power up that sets all but one flip-flop in the chain of pump multiplexers to a LO value through NOR gates 502, 503. The one pump multiplexer flip-flop that is not set LO has NAND gates replacing NOR gates 502 and 503. The NAND gates set the value of that flip-flop HI. This HI flip-flop may be considered that "first" flip-flop in the serial register chain.

If the pump bit is present during a local pump pulse, logical AND 506 produces internal pump enable pulse 510. If an array has been previously selected and boosted with an activate operation, its phibs_en signal 831 is HI as a result of either a activation pump or a pump enable signal pump. When internal pump enable 510 pulses HI, timing circuit 515 first produces a negative-going pulse on pump reset 821. This grounds phi_bs through pump enable block (not shown in FIG. 5), grounds the associated wordline to prepare it for the voltage boost operation, and sets phibs_en 831 LO. When boost enable 831 goes LO, pump reset 821 returns to HI. This implementation is self-timed utilizing inverter delay string 516.

The negative pulse on pump reset 821 also sets internal latch 518 HI. NAND gate 519 combines the HI value from internal latch 518 with the now LO internal pump enable 510 to produce a LO level at pump set 822. This causes the boost voltage generator to reboot the associated wordline (not shown in FIG. 5). Inverter string 517 delays the LO pump set signal and resets internal latch 518 LO, thus the pump set signal is self-timed. Although this operation could be achieved by other means, such as synchronous or asynchronous logic for example, the above implementation removes the need for a separate address bus.

In summary, the pump multiplexer blocks are connected as a circular shift register through which the pump bit is shifted in response to a global pump signal on the control bus. If the pump bit is available to (present at) a pump multiplexer block, and if the associated array has an active wordline (i.e. a booted wordline), the pump multiplexer block will generate the proper timing to reboot the wordline and other nodes.

Pump Enable

Figure 6:
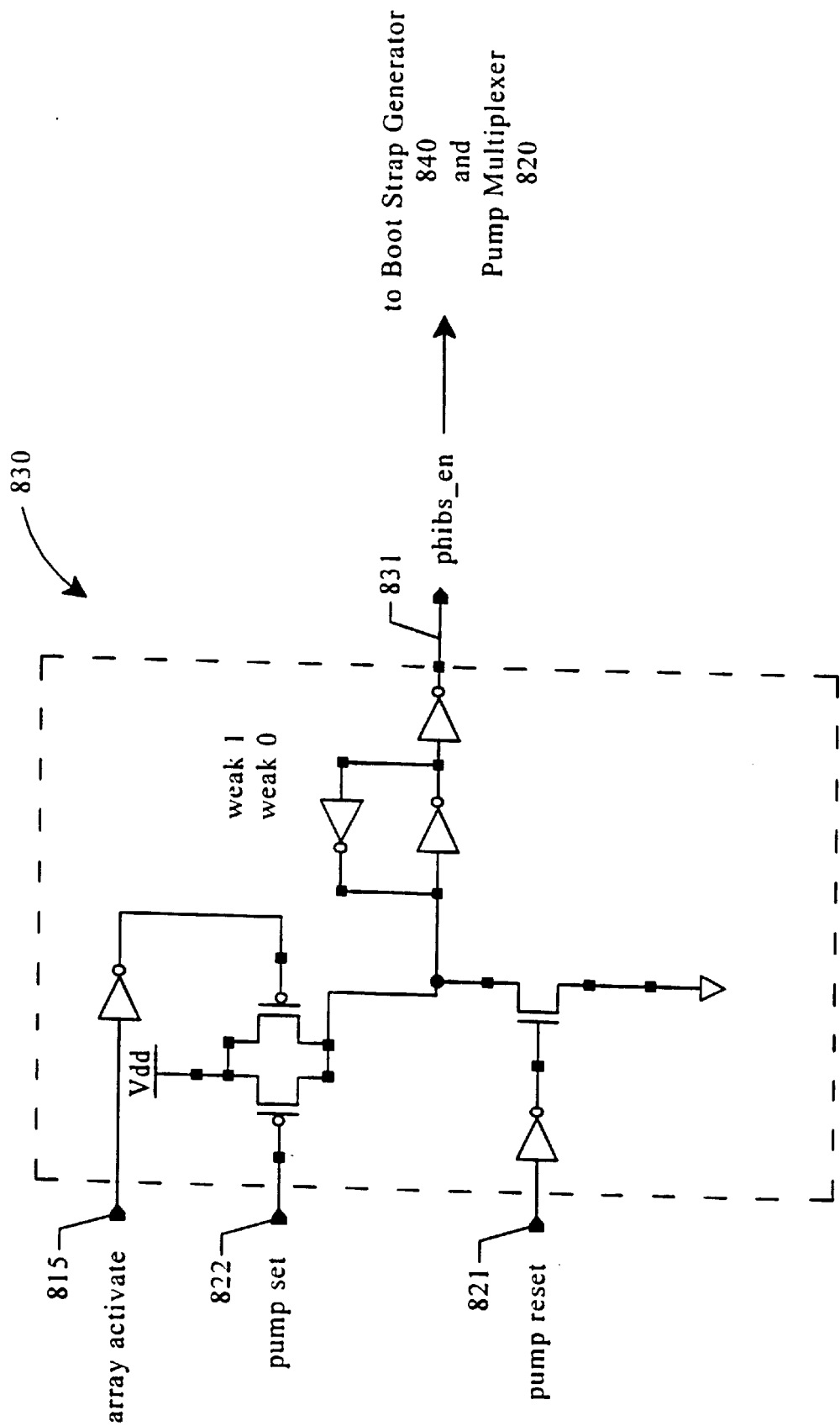
FIG. 6 is a circuit diagram of one embodiment of the pump enabling circuit of FIG. 4.

FIG. 6 shows one embodiment of a pump enabling block 830. This block insures that active arrays are booted while inactive arrays are not. The output of this block is a phibs_en signal that either grounds the associated boost voltage generator and wordline in preparation for a voltage pump, or initiates a voltage pump.

There are two ways to generate a phibs_en signal, either way initiates a voltage pump. The first way is if this block receives an array activate signal 815 from pump address block 810 (not shown in FIG. 6). If an array is not presently addressed, it's wordline is already at ground potential, and no event need occur prior to a voltage pump.

The second way is to receive the pump set and pump reset signals from a pump multiplexer. A pulse on the pump reset grounds the wordline and prepares the boost generator for a voltage pump. Then, a pulse on pump set 822 sends phibs_ en 831 HI and initiates a voltage pump. As discussed above, the timing of these signals is achieved on-chip. A latch captures and holds the state of array activate 815, pump set 822, and pump reset 821, so that the inputs need be only pulses.

Further Details of Specific Embodiments

As described and illustrated in FIG. 4, each memory array is assumed to be independent of its neighbor. However, neighboring arrays typically share sense amplifiers. Since neighboring arrays share sense amplifiers, they cannot both be active, i.e. they cannot both have booted wordlines, at the same time. It is therefore possible to also share boost generator circuits between these same neighboring arrays. This saves area on the chip otherwise required for the capacitively-connected transistors in each boost generator circuit. The shared wordline boost circuit is the subject of a commonly-assigned, related pending U.S. patent application Ser. No. 08/656,165, filed on May 31, 1996 and entitled Shared Bootstrap Circuit, by Robert J. Proebsting, which is hereby incorporated in its entirety for all purposes.

As discussed above, activating an array takes more time than boosting its wordline. Hence, there is a hold-off period while an array is being activated, during which the pump bit is ignored. This is because it is disadvantageous to return the wordline to ground and reboot it when it is already in process of being booted. This provides that the local pump pulse may be asserted at any time, without regard to activate commands. This results in simpler global pump control.

It is also possible, when arrays are sharing boost generator blocks, to input the pump bit into both associated pump multiplexer blocks simultaneously. That is, the pump inputs of the shared pair of arrays are connected together, and only one of the pump multiplexers passes the pump bit to the next pair of pump multiplexers. Equivalently, a pump multiplexer block may be shared between a pair of arrays. This has the effect of the pump bit "skipping" the inactive array in an array pair, and decreasing the time it takes for the pump bit to travel around the ring. Because each array in the ring is boosted before its voltage decays to an inactive level, an array may be kept open until its neighboring array is selected and activated.

While the above is a complete description of specific embodiments of the present invention, various modifications, variations, and alternatives may be employed. The scope of this invention, therefore, should not be limited to the embodiments described, and should instead be defined by the following claims.

What is claimed is:

1. A method of operating an electronic circuit comprising, in order:
   (a) grounding an output of a boost voltage generator in response to a pump reset signal;
   (b) essentially concurrently with step (a), grounding a wordline voltage to set a gate voltage of a gate of a driver transistor to a first voltage, a source of the driver transistor being electrically coupled to a wordline; and
   (c) pumping the boost voltage generator in response to a pump set signal to produce a boost voltage, the boost voltage being electrically coupled to a drain of the driver transistor, to produce a double-boosted gate voltage of the driver transistor.

2. The method of claim 1 wherein the electronic circuit is a memory circuit.

3. The method of claim 2 wherein the memory circuit is a dynamic random access memory circuit.

4. The method of claim 1 wherein the first voltage is equal to about a bias voltage of the electronic circuit minus about a threshold voltage of the driver transistor.

5. The method of claim 4 wherein the bias voltage of the electronic circuit is a drain bias voltage (Vdd).

6. The method of claim 1 further comprising, in order, between the step (a) and the step (c):

boosting an isolation gate voltage of an isolation transistor above a bias voltage of the electronic circuit, a source of the isolation transistor being electrically coupled to a switch capable of providing the bias voltage to the source of the isolation transistor, the switch being open, a drain of the isolation transistor being electrically coupled to the gate of the driver transistor;

switching the switch to provide the bias voltage at the source of the isolation transistor, the bias voltage being transferred to the gate of the driver transistor; and clamping the isolation gate voltage to the bias voltage of the electronic circuit.

7. The method of claim 6 wherein, after the step of switching the switch, the gate voltage of the driver transistor is about equal to the bias voltage at a time of the pump set signal.

8. A method of operating an electronic memory circuit comprising, in order:

(a) grounding an output of a boost voltage generator in response to a pump reset signal;

(b) essentially concurrently with step (a), grounding a wordline voltage to set a gate voltage of a driver transistor to a first voltage, a source of the driver transistor being electrically coupled to a wordline;

(c) boosting a gate voltage of an isolation transistor above a bias voltage of the electronic circuit, a source of the isolation transistor being electrically coupled to a switch capable of providing the bias voltage to the source of the isolation transistor, the switch being open, a drain of the isolation transistor being electrically coupled to the gate of the driver transistor;

(d) switching the switch to provide the bias voltage at the source of the isolation transistor, the bias voltage being coupled to the gate of the driver transistor;

(e) clamping the gate voltage of the isolation transistor to the bias voltage of the electronic circuit; and (f) pumping the boost voltage generator in response to a pump set signal to produce a boost voltage, the boost voltage being electrically coupled to a drain of the driver transistor to produce a double-boosted gate voltage of the driver transistor.

* * * * *